(12) United States Patent
Iravani

(10) Patent No.: US 7,541,850 B1
(45) Date of Patent: Jun. 2, 2009

(54) PLL WITH LOW SPURS

(75) Inventor: Kamran Iravani, Los Altos, CA (US)

(73) Assignee: PICO Semiconductor, Inc., Los Altos, CA (US)

( * ) Notice: Subject to any disclaimer, the term of this patent is extended or adjusted under 35 U.S.C. 154(b) by 12 days.

(21) Appl. No.: 11/804,169

(22) Filed: May 16, 2007

(51) Int. Cl.
*H03L 7/06* (2006.01)

(52) U.S. Cl. ..................................... 327/156; 327/147

(58) Field of Classification Search .................. None
See application file for complete search history.

(56) References Cited

U.S. PATENT DOCUMENTS 5,410,263 A * 4/1995 Waizman .................... 327/141
6,420,917 B1 * 7/2002 Klemmer .................... 327/156
7,145,400 B2 * 12/2006 Horan ........................ 331/17
2007/0096835 A1 * 5/2007 Chien ......................... 331/16

* cited by examiner

*Primary Examiner*—Cassandra Cox

(57) ABSTRACT

A PLL circuit having a low spur output. The PLL circuit includes a PFD (Phase-Frequency Detector), a charge-pump coupled to the PFD, an SCR (switch-capacitor resistor) coupled to the charge pump, a filter coupled to the SCR, and a VCO circuit coupled to the filter, wherein the SCR reduces an amplitude of a plurality of current pulses at an output of the charge-pump before the plurality of current pulses reach an input of the VCL circuit.

20 Claims, 3 Drawing Sheets

PLL WITH LOW SPURS

TECHNICAL FIELD

The present invention relates to the field of CMOS technology Phase-Locked Loop (PLL). More particularly, the present invention relates to a low spurs CMOS PLL.

BACKGROUND ART

PLLs are well known and widely used in the electronics industry. Within the digital field, PLLs are used in a variety of applications. Such applications include, for example, frequency synthesizers, clock generation, clock recovery and the like. PLLs are typically designed to perform within a given set of boundary conditions and to perform according to a specified standard. Typical conditions include, for example, performance over operating temperature ranges, sensitivity to noise, output sensitivity to interference, and the like. Typical performance standards include, for example, output signal frequency stability, output signal programmability, and the like.

A typical prior art PLL circuit generates an oscillating output signal having a specified frequency. The frequency of the output is tunable and is a function of an input frequency, the dividers, or the like. The type of application in which the PLL circuit is used dictates its operating conditions and performance requirements.

In addition, the type of application also largely determines type of fabrication technology used to manufacture the PLL. A large number of modern digital integrated circuits are fabricated using well known and widely used CMOS technology. Where the PLL circuit is included in a CMOS IC (integrated circuit), it is usually fabricated in CMOS (e.g., fabricated using CMOS process technology).

There is a problem, however, when the application in which the overall IC is used requires the PLL circuit to have low spurs. For example, where the IC is part of a high speed serial transmission system (e.g., high speed wireless transmission systems) it is important that the output signal of the PLL circuit shows low spurs. Spurs in a PLL refers to the pulses at the output of a charge-pump of the PLL which causes a ripple at the input of the VCO, and thus modulates the VCO frequency. This will cause sidebands around the fundamental frequency of the PLL. These sidebands are generally referred to as spurs. Prior art CMOS PLLs have tried to solve this issue but in some cases the complexity of the prior art techniques make the system unreliable and in other cases with simple techniques, the performance is not that good.

Thus, what is required is a CMOS PLL circuit which solves the low spurs and low noise operation problems of the prior art. What is required is a circuit capable of reliable operation while exhibiting low spurs on the output signal. What is required is a circuit which produces a stable output signal with a waveform with low noise, free of defects and irregularities. The present invention provides an advantageous solution to the above requirements.

DISCLOSURE OF THE INVENTION

Embodiments of the present invention provide a PLL circuit which solves the low spurs operation problems of the prior art. The present invention provides a circuit capable of reliable operation while exhibiting very low spurs.

In one embodiment, the present invention is implemented as a low spurs CMOS Phase-Locked Loop (PLL) circuit. In this implementation, the PLL circuit includes a Phase-Frequency Detector (PFD), one or more charge-pumps, one or more switch-capacitor resistor, a filter, a VCO circuit and a divider which can be removed depending on the application. In the locked condition the phase detector produces UP and DN signals which turns on and off the output current of the charge-pump. The charge-pump current after going through a Switched-Capacitor Resistor (SCR) charge or discharge the filter capacitor and the DC voltage generated at the filter output causes the output frequency of the VCO to be equal to N×Fref. The SCR causes the current pulses at the output of the charge-pump becomes much smoother before charge or discharging the filter. Therefore, it reduces the ripple at the input of the VCO which in turn reduces spurs and the noise of the PLL's output signal.

In one embodiment, the signals in the PLL can be differential or complementary signals. This technique can also be used for similar circuit like Clock/Data-Recovery (CDR) circuits or the like. For the applications that require more than one charge-pumps to be used, the SCR can be used in front of one or more charge-pumps.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE EMBODIMENTS

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the embodiments of the present invention.

The present invention provides a CMOS PLL circuit which solves the low spurs operation problems of the prior art. The present invention provides a circuit capable of reliable operation while exhibiting very low spurs on the output signal. The circuit of the present invention produces a stable, output signal with a waveform free of defects and irregularities. The present invention and its benefits are described in greater detail below.

Figure 1:
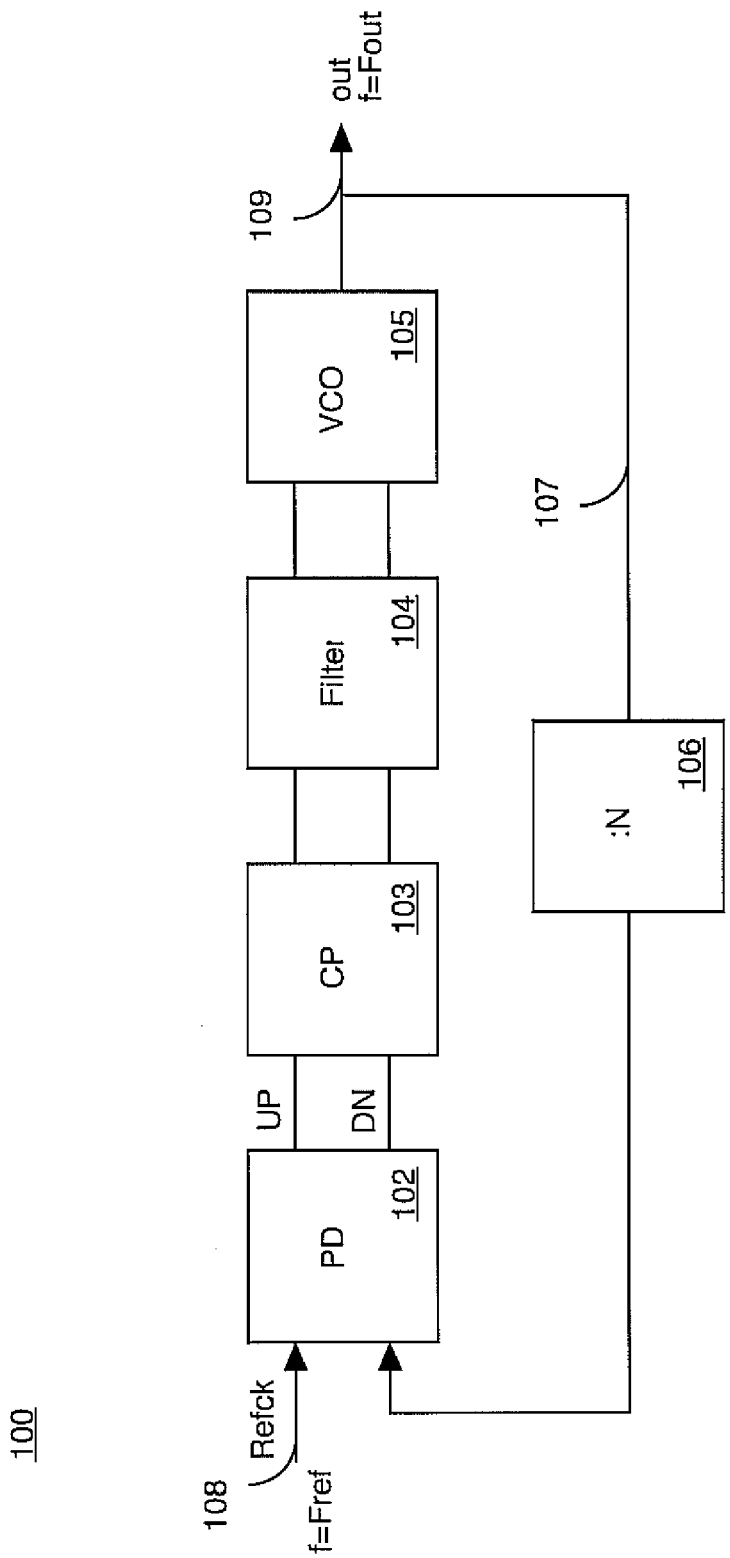
FIG. 1 shows a schematic block diagram of a conventional charge-pump PLL.

FIG. 1 shows a block diagram of a conventional PLL 100 in accordance with one embodiment of the present invention. PLL 100 provides a general overview of the oscillating elements which produce the output frequency of the present invention. PLL 100 is comprised of a Phase-Frequency Detector (PFD) 102 followed by a Charge-Pump (CP) 103, a filter 104, a VCO 105 and a divider 106 in the feedback 107 path with its output connected to the PFD 102. The other input of the PFD comes from a reference clock Refck 108 with the frequency of Fref. The output of the PLL 100 is the output of the VCO 105 with frequency equal to Fout. Since the PLL loop correction takes place for every 1/Fref seconds, the charge-pump pulses, which charge or discharges the loop-filter which then causes a ripple with the frequency of fref at the input of the VCO 105. This causes the frequency of the VCO 105 to be modulated and therefore cause spurs.

Figure 2A:
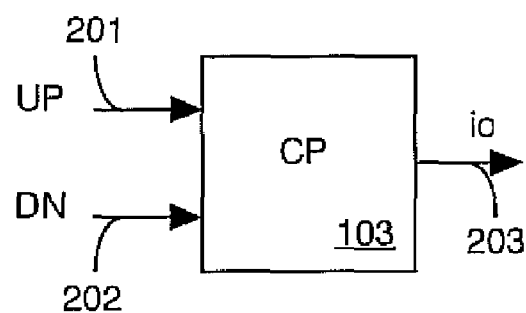
FIG. 2A shows a charge-pump as a block with its output and inputs.

FIG. 2A shows a block diagram of the charge-pump 103 with its inputs (UP 201 and DN 202) and the output I/O 203. The inputs 201-202 and output 203 can also be differential or complementary. In a PLL during the UP and DN transitions, a current spike at the output causes a ripple at the input of the VCO 105 which causes spurs.

Figure 2B:
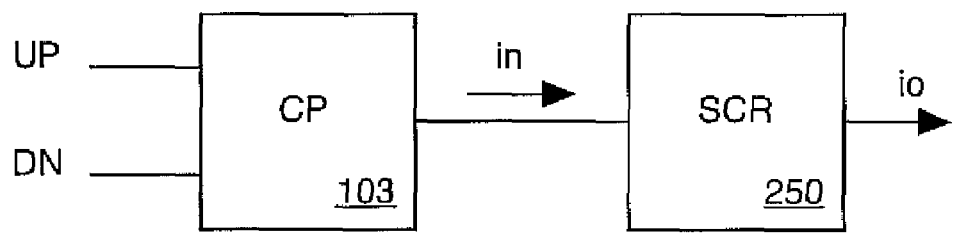
FIG. 2B shows charge-pump followed by an SCR in accordance with one embodiment of the present invention.

FIG. 2B shows the solution to reduce the current spikes significantly and consequently reducing the ripple at the input of the VCO 105 and the spurs. In fact an SCR is placed immediately after the charge-pump. The SCR provides a number of benefits:

1. The SCR prevents spurs from occurring.

2. The SCR solution requires a comparatively small amount of integrated circuit die area to implement.

3. The SCR solution is comparatively straightforward to implement in CMOS technology.

4. The SCR solution is very reliable and very robust in comparison to prior art solutions.

5. The SCR solution does not rely on reference voltages or require switching to ground voltage level (e.g., which can cause further problems).

Figure 3:
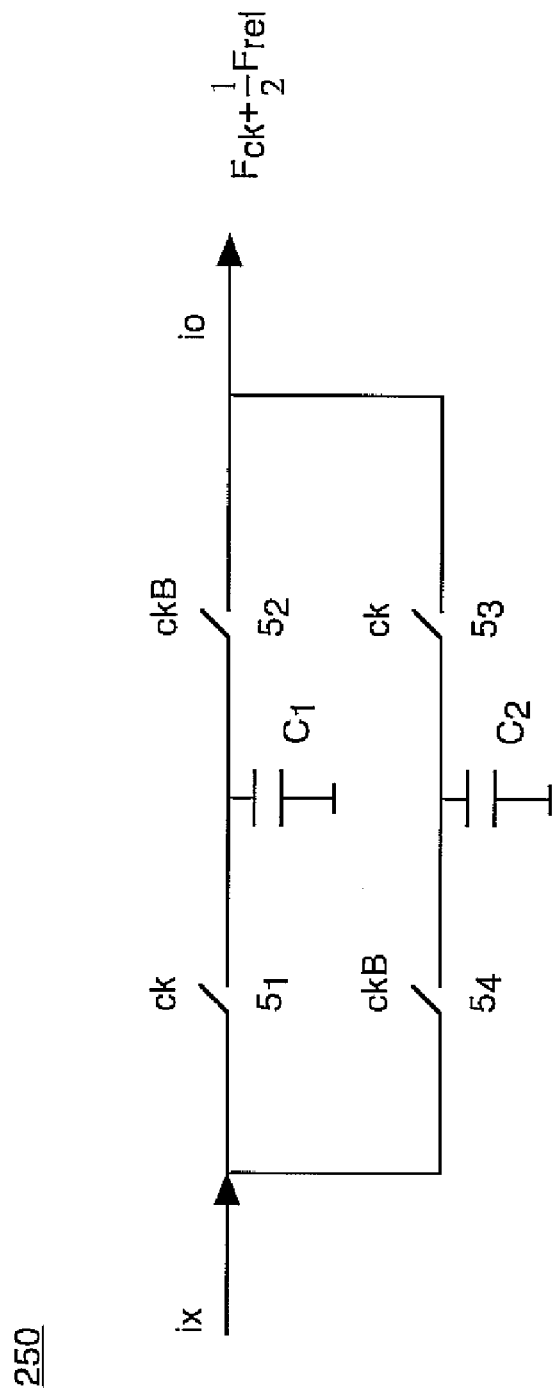
FIG. 3 shows the implementation of the switched capacitor resistor in accordance with one embodiment of the present invention.

FIG. 3 shows the circuit used for the SCR 250 in accordance with one embodiment of the present invention. In this circuit there are four switches S1, S2, S3, S4 and 2 capacitors C1 and C2. The frequency of the signals applied to the switches (CK and CKB) is Fref/2. Since CKB is the same as CK with 180 degree phase difference, either S1 and S3 are on and S2 and S4 are off or vice versa. CK and CKB can also be non-overlapping signals. In any case for a better performance, during the UP/DN transitions, CK and CKB should be already stable and not in the transition mode. The idea here is that the current spikes at the output of the charge-pump 103 instead of directly affecting the filter 104, first charges the capacitance C1 or C2 (depending on which switches are on) then on the next cycle of fref the capacitor discharges to the filter which is much smoother and cause much smaller ripple at the input of the VCL 105 and consequently reducing the spurs. This schematic for SCR has been used as a replacement for a resistor for different applications. However, it has never been used as a charge transferring block in front of the charge-pump the way it is used here. The frequency of the switching can also be different from Fref/2.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A PLL circuit having a low spur output, comprising:
    a PFD (Phase-Frequency Detector);
    a charge-pump coupled to the PFD;
    an SCR (switch-capacitor resistor) coupled to the charge pump;
    a filter coupled to the SCR; and
    a VCO circuit coupled to the filter, wherein the SCR reduces an amplitude of a plurality of current pulses at an output of the charge-pump before the plurality of current pulses reach an input of the VCO circuit.

2. The circuit of claim 1, wherein the PFD produces a first signal for turning on the output of the charge pump and produces a second signal for turning off the output of the charge pump.

3. The circuit of claim 1, wherein the SCR charges or discharges a capacitor within the filter and a DC voltage generated at an output of the filter controls an output frequency of the VCO.

4. The circuit of claim 3, wherein the SCR causes current pulses at the output of the charge-pump to reduce an amplitude before charging or discharging the filter.

5. The circuit of claim 4, wherein the SCR reduces the amplitude before charging or discharging the filter and reduces a ripple at the input of the VCO.

6. The circuit of claim 1, wherein the charge pump receives a differential input signal from the PFD.

7. The circuit of claim 1, wherein the charge pump receives a complimentary input signal from the PFD.

8. The circuit of claim 1, wherein a plurality of SCRs are included in front of a corresponding plurality of charge pumps.

9. An integrated circuit device, comprising:
    a CMOS integrated circuit die, wherein the integrated circuit die further comprises:
    a PLL circuit having a low spur output, including:
    a PFD (Phase-Frequency Detector);
    a charge-pump coupled to the PFD;
    an SCR (switch-capacitor resistor) coupled to the charge pump;
    a filter coupled to the SCR; and
    a VCO circuit coupled to the filter, wherein the SCR reduces an amplitude of a plurality of current pulses at an output of the charge-pump before the plurality of current pulses reach an input of the VCO circuit.

10. The circuit of claim 9, wherein the PFD produces a first signal for turning on the output of the charge pump and produces a second signal for turning off the output of the charge pump.

11. The circuit of claim 9, wherein the SCR charges or discharges a capacitor within the filter and a DC voltage generated at an output of the filter controls an output frequency of the VCO.

12. The circuit of claim 9, wherein the SCR causes current pulses at the output of the charge-pump to reduce an amplitude before charging or discharging the filter.

13. The circuit of claim 12, wherein the SCR reduces the amplitude before charging or discharging the filter and reduces a ripple at the input of the VCO.

14. The circuit of claim 9, wherein the charge pump receives a differential input signal from the PFD.

15. The circuit of claim 9, wherein the charge pump receives a complimentary input signal from the PFD.

16. The circuit of claim 9, wherein a plurality of SCRs are included in front of a corresponding plurality of charge pumps.

17. A CMOS integrated circuit device, comprising:
a PLL circuit having a low spur output, including:
a PFD (Phase-Frequency Detector);
a charge-pump coupled to the PFD;
an SCR (switch-capacitor resistor) coupled to the charge pump;
a filter coupled to the SCR; and
a VCO circuit coupled to the filter, wherein the SCR reduces an amplitude of a plurality of current pulses at an output of the charge-pump before the plurality of current pulses reach an input of VCO circuit, and wherein the PFD produces a first signal for turning on the output of the charge pump and produces a second signal for turning off the output of the charge pump, wherein the SCR charges or discharge a capacitor within the filter and a DC voltage generated at an output of the filter controls an output frequency of the VCO.

18. The circuit of claim 17, wherein the SCR causes current pulses at the output of the charge-pump to reduce an amplitude before charging or discharging the filter.

19. The circuit of claim 17, wherein the SCR reduces the amplitude before charging or discharging the filter and reduces a ripple at the input of the VCO.

20. The circuit of claim 17, wherein a plurality of SCRs are included in front of a corresponding plurality of charge pumps.

* * * * *